(12) United States Patent
Tseng

(10) Patent No.: US 6,344,374 B1
(45) Date of Patent: Feb. 5, 2002

(54) METHOD OF FABRICATING INSULATORS FOR ISOLATING ELECTRONIC DEVICES

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/689,168

(22) Filed: Oct. 12, 2000

(51) Int. Cl.⁷ .............................................. H01L 21/82
(52) U.S. Cl. .................. 438/131; 438/132; 438/150; 438/156; 437/41; 437/69; 437/130; 357/44; 148/1.5
(58) Field of Search ................................ 438/131, 150, 438/132, 156; 437/69, 41, 130; 357/44; 148/1.5

(56) References Cited

U.S. PATENT DOCUMENTS 4,159,915 A * 7/1979 Anantha et al. ............. 148/1.5
4,214,315 A * 7/1980 Anantha et al. ............... 357/44
5,272,098 A * 12/1993 Smayling et al. ............. 437/41
5,679,601 A * 10/1997 Wu ............................. 437/69

* cited by examiner

Primary Examiner—Richard Elms
Assistant Examiner—Pho Luu
(74) Attorney, Agent, or Firm—Intellectual Property Solutions, P.L.L.C.

(57) ABSTRACT

The present invention discloses a method of forming an isolation region in a silicon-containing substrate. The method includes forming a mask layer on the silicon-containing substrate. A window is subsequently formed in the mask layer to expose the isolation area to be formed in the substrate. An oxygen-containing region is formed in the substrate by introducing oxygen-containing ions through the window in the mask layer. Then, the oxygen-containing region is subjected to a thermal treatment, thereby resulting in a silicon oxide insulator ($SiO_x$) for isolating electronic devices.

20 Claims, 3 Drawing Sheets

METHOD OF FABRICATING INSULATORS FOR ISOLATING ELECTRONIC DEVICES

BACKGROUND OF THE INVENTION

1. Field of the Invention

The present invention relates in general to device isolation techniques. More particularly, it relates to a novel method of forming an isolation region in a silicon-containing substrate.

2. Description of the Related Arts

Device isolation techniques play an important role in the design and performance of highly integrated semiconductor circuits by electrically isolating regions and devices therein from adjacent devices and regions. Moreover, as the degree of integration in semiconductor circuits increases, there is a concomitant need to develop techniques for forming isolation regions which are free of defects and can be scaled to provide isolation regions having smaller dimensions, but without sacrificing the isolation capability of the regions.

One widely used and relatively simple technique for providing device isolation is typically referred to as local oxidation of silicon (LOCOS). Unfortunately, this technique has a number of disadvantages because it typically includes the formation of bird's beak oxide extensions, induces lattice stress which can lead to the formation of crystal defects in semiconductor substrates, and causes redistribution of channel-stop dopants. As will be understood by those skilled in the art, these disadvantages typically cause a reduction in the lateral area available for active devices, and degrade the reliability and performance of devices formed in adjacent active regions.

Another method which may be considered an improvement over the LOCOS method is typically referred to as the shallow trench isolation (STI) method. In the STI method, a device isolation region is established by selectively etching a semiconductor substrate to form trenches therein and then filling the trenches with an electrically insulating region (e.g., oxide). A chemical etching and/or chemical-mechanical polishing (CMP) step can then be performed to planarize the electrically insulating region to be level with the surface of the substrate. Because the STI method typically does not include a lengthy thermal oxidation step as typically required by the LOCOS method, many of the disadvantages of the LOCOS method can be eliminated to some degree. However, as will be understood by those skilled in the art, the STI method may be prone to a "dishing" phenomenon which can degrade the isolation characteristics of trench isolation regions. In addition, the trench etching causes damage to the semiconductor substrate.

SUMMARY OF THE INVENTION

In view of the above mentioned shortcomings, an object of the present invention is to provide a new isolation method in addition to the traditional STI and LOCOS methods.

Another object of the invention is to provide a new isolation method, by which the formation of bird's beak oxide extensions in the LOCOS method can be eliminated.

A further object of the invention is to provide a new isolation method, by which the disadvantages of the STI method, such as the "dishing" phenomenon and the etching damage to substrate, can be obviated.

To attain the above and other objects, the present invention provides a method of forming an isolation region in a silicon-containing substrate, which includes the steps of: (a) forming a mask layer on the silicon-containing substrate; (b) forming a window in the mask layer to expose the isolation area to be formed in the substrate; (c) forming an oxygen-containing region in the substrate by introducing oxygen-containing ions through the window in the mask layer; and (d) thermally treating the oxygen-containing region to form a non-buried silicon oxide insulator which serves as an isolation region for isolating electronic devices.

Optionally, a barrier layer is provided on the substrate surface before forming the mask layer. The barrier layer can be used as an implanting barrier when introducing the oxygen-containing ions into the substrate.

Other objects, features, and advantages of the present invention will become apparent from the following detailed description which makes reference to the accompanying drawings.

DESCRIPTION OF THE PREFERRED EMBODIMENTS

Figure 1:
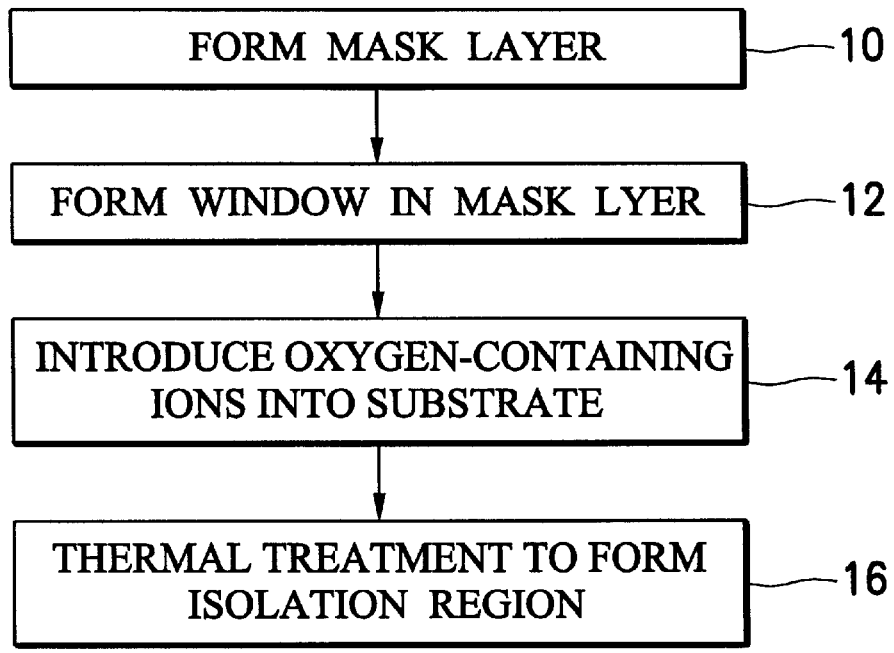
FIG. 1 is a block diagram sequentially showing isolation methods according to the present invention.

The present invention now will be described more fully hereinafter with reference to the accompanying drawings. FIG. 1 is a block diagram of trench isolation methods according to the present invention. The methods of FIG. 1 include a first step of forming a mask layer (Block 10), a second step of forming a window in the mask layer (Block 12), a third step of introducing oxygen-containing ions through the window in the mask layer (Block 14), and a forth step of thermally treating the oxygen-containing ions to form an isolation region (Block 16).

Figure 2:
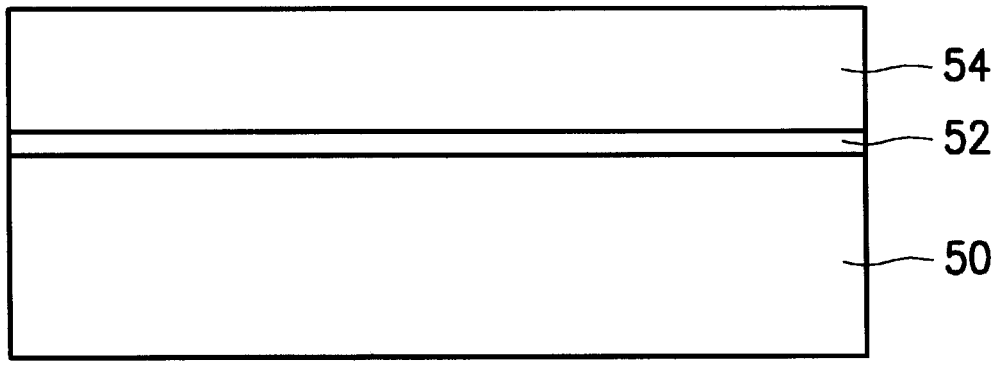
FIGS. 2–7 are schematic cross-sectional views illustrating isolation methods according to a preferred embodiment of the invention.

Referring now to FIGS. 2–7, a preferred method of forming an isolation region according to an embodiment of the present invention will be described. As illustrated in FIG. 2, the method of the present invention begins by providing a silicon substrate 50. In the context of this document, the term "silicon substrate" is meant to include devices formed within a silicon wafer and the layers overlying the wafer. The term "substrate surface" is meant to include the upper most exposed layers on a silicon wafer, such as silicon surface and an insulating layer.

FIG. 2 shows the step of forming a mask layer 54 on a silicon wafer 50. The silicon substrate 50 is covered with a material used for an implanting mask, for example, photoresist, to form a mask layer 54. Other materials which are suitable for blocking oxygen atoms such as a dielectric layer of silicon dioxide or silicon nitride, can be used as mask 54.

According to a more preferred embodiment, before forming the mask layer 54, a barrier layer 52 with a predetermined thickness is formed on the silicon substrate 50 to serve as an implanting barrier (as described below in conjunction with FIG. 4). Examples of suitable materials for the barrier layer 52 include dielectric materials such as silicon nitride and silicon oxide, and electrically conductive materials such as amorphous silicon and polysilicon. Of course, other suitable dielectric and electrically conductive materials can be used.

Figure 3:
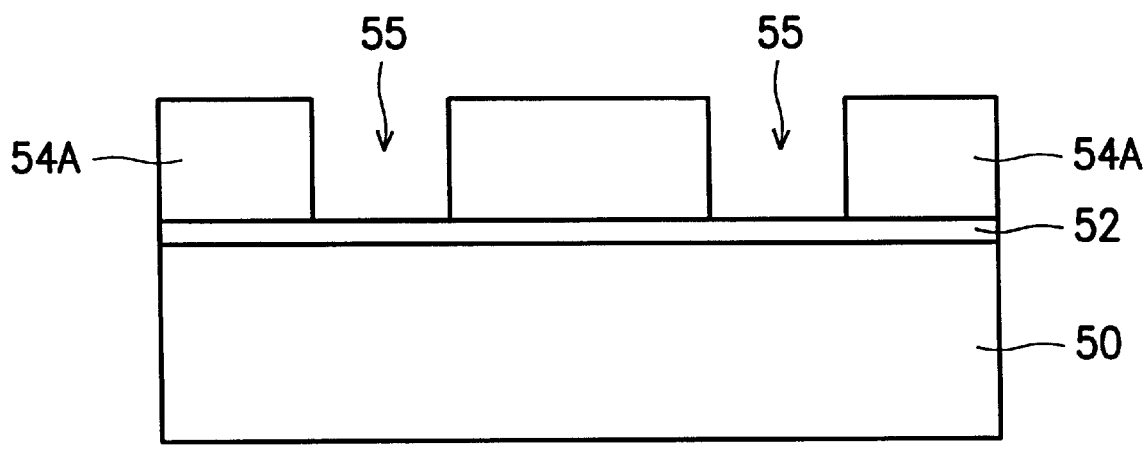

FIG. 3 shows the step of forming windows 55 in the mask layer 54. The mask layer 54 is then patterned until part of the barrier layer 52 is exposed to form a mask pattern 54A. The mask pattern includes windows 55 which expose the barrier layer above the isolation areas to formed in the substrate.

Figure 4:
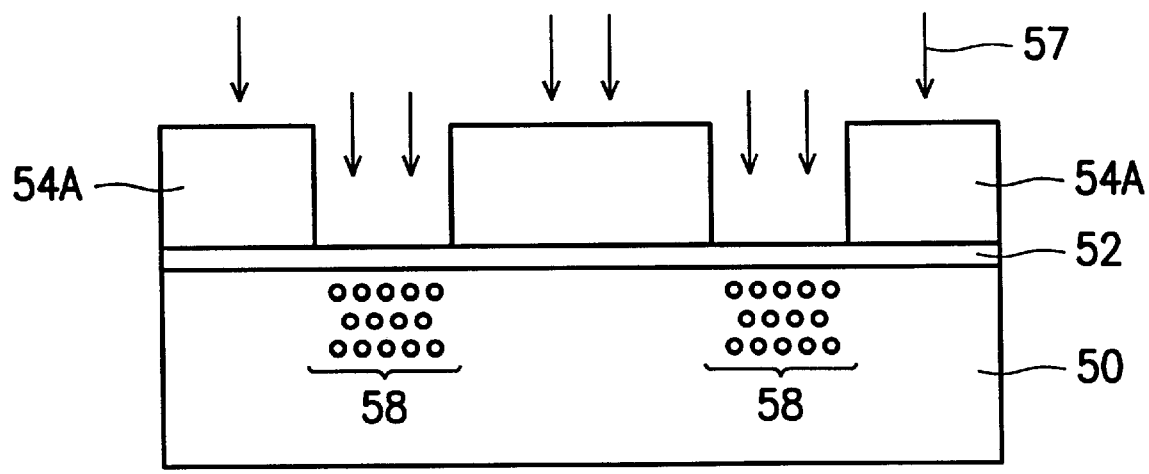

FIG. 4 shows the step of introducing oxygen-containing ions in the substrate through the mask pattern 54A. Oxygen-containing regions 58 are formed by implanting oxygen ions (shown by arrows 57) through the windows 55 and the barrier layer 52. The mask pattern 54A blocks oxygen ions from entering active areas of the substrate 50. During the implantation, the barrier layer serves as an implanting barrier to adjust the depth and the distribution of the implanted ions in the substrate. According to the present invention, the implantation is conducted in such a way that the oxygen-containing regions 58 are provided immediately below the substrate surface. Therefore, the implanting energy depends on the thickness and the material of the barrier layer 52.

Figure 5:
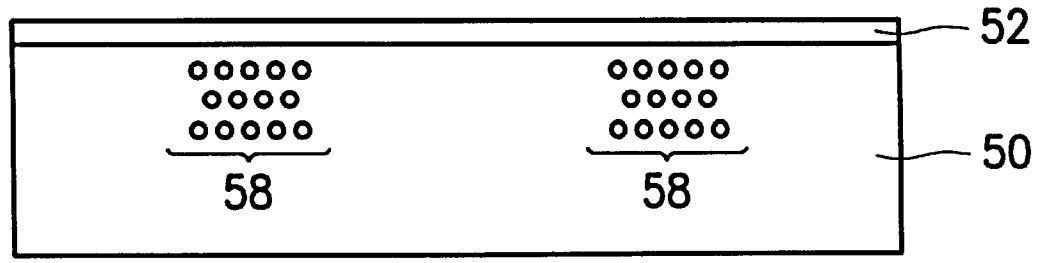

FIG. 5 shows the step of removing the mask pattern 54A from the substrate. This is done before the thermal treatment of the oxygen-containing regions 58 when the mask pattern 54A is a photoresist pattern. However, where the mask pattern 54A is formed of a heat-resistant material such as silicon oxide or silicon nitride, it can be removed either before or after the thermal treatment.

Figure 6:
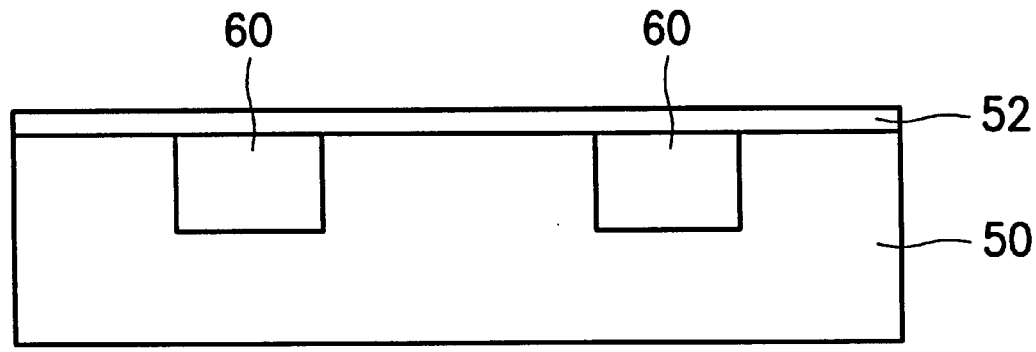

FIG. 6 shows the step of thermally treating the oxygen-containing regions 58 to convert them into isolation regions 60. The oxygen-containing regions 58 are subjected into thermal annealing, which induces reactions between the implanted oxygen and silicon within the substrate 50, thereby resulting in the formation of silicon oxide ($SiO_x$) insulators 60. Since, as mentioned earlier, the regions 58 are provided immediately below the substrate surface, the insulators 60 thus formed are non-buried as shown. Thereby, the isolation regions 60 for isolating electronic devices are fabricated without the formation of bird's beak extensions or etching to the substrate.

Figure 7:
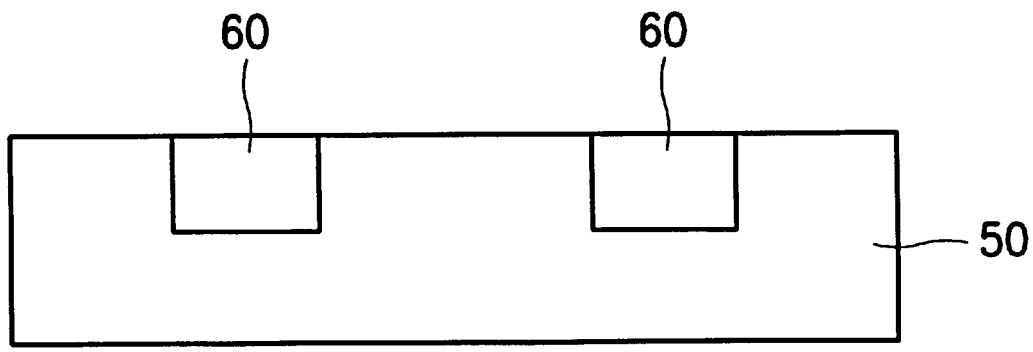

After the formation of isolation regions 60, the barrier layer 52 may serve as a sacrificial oxide layer as in a conventional STI method. Therefore, ion implantation of impurities, for example, ion implantation for wells, channel stops, or threshold voltage control, may be performed through the barrier layer. Then, the barrier layer is removed by a suitable wet etching or dry etching step to reveal the isolation regions 60 as shown in FIG. 7.

While the invention has been particularly shown and described with reference to the preferred embodiment thereof, it will be understood by those skilled in the art that various changes in form and details may be made without departing from the spirit and scope of the invention.

What is claimed is:

1. A method of forming an isolation region in a silicon-containing substrate, comprising the steps of:

forming a mask layer on the silicon-containing substrate;

forming a window in said mask layer to expose the isolation region to be formed in the substrate;

introducing oxygen-containing ions through the window in the mask layer;

forming an oxygen-containing region in said substrate from the introduced oxygen-containing ions;

thermally treating the oxygen-containing region; and forming a non-buried silicon oxide insulator from the thermally treated oxygen-containing region wherein the non-buried silicon oxide insulator serves as an isolation region for isolating electronic devices.

2. The method as claimed in claim 1, wherein the step of forming an oxygen-containing region comprising implanting oxygen ions in the substrate.

3. The method as claimed in claim 1, wherein the mask layer is a photoresist layer.

4. The method as claimed in claim 1, wherein the mask layer is a dielectric layer.

5. The method as claimed in claim 1, wherein the following step is performed prior to the step of thermally treating the oxygen-containing region:

removing the mask layer from the substrate.

6. The method as claimed in claim 1, wherein the following step is performed after the step of thermally treating the oxygen-containing region:

removing the mask layer from the substrate.

7. A method of forming an isolation region in a silicon-containing substrate, comprising the steps of:

forming a barrier layer on the silicon-containing substrate;

forming a mask layer on the barrier layer;

forming a window in said mask layer to expose a portion of the barrier layer;

introducing oxygen-containing ions through the exposed portion of the barrier layer;

forming an oxygen-containing region in said substrate from the introduced oxygen-containing ions;

thermally treating the oxygen-containing region; and forming a non-buried silicon oxide insulator from the thermally treated oxygen-containing region wherein the non-buried silicon oxide insulator serves as an isolation region for isolating electronic devices.

8. The method as claimed in claim 7, wherein said barrier layer is formed of dielectric material.

9. The method as claimed in claim 7, wherein said barrier layer is formed of electrically conductive material.

10. The method as claimed in claim 7, wherein the step of forming an oxygen-containing region comprising implanting oxygen ions in the substrate.

11. The method as claimed in claim 7, wherein the mask layer is a photoresist layer.

12. The method as claimed in claim 7, wherein the mask layer is a dielectric layer.

13. The method as claimed in claim 7, wherein the following step is performed prior to the step of thermally treating the oxygen-containing region:

removing the mask layer from the substrate.

14. The method as claimed in claim 7, wherein the following step is performed after the step of thermally treating the oxygen-containing region:

removing the mask layer from the substrate.

15. A semiconductor device comprising:

a silicon-containing substrate with an isolation region;

a mask layer formed on the silicon-containing substrate;

a window formed in the mask layer to expose an isolation area to be formed in the substrate;

an oxygen-containing region formed in the substrate by introducing oxygen-containing ions through the window in the mask layer; and a non-buried silicon oxide insulator formed by thermally treating the oxygen-containing region wherein the non-buried silicon oxide insulator serves as the isolation region for isolating electronic devices.

16. The device of claim 15 wherein oxygen ions are implanted in the substrate.

17. The device of claim 15 wherein the mask layer is a photoresist layer.

18. The device of claim 15 wherein the mask layer is a dielectric layer.

19. The device of claim 15 wherein the mask layer is removed from the substrate before the oxygen-containing region is thermally treated.

20. The device of claim 15 wherein the mask layer is removed from the substrate after the oxygen-containing region is thermally treated.

* * * * *